US011333701B2

(12) United States Patent
Yawata et al.

(10) Patent No.: US 11,333,701 B2
(45) Date of Patent: May 17, 2022

(54) CURRENT SUPPLY DEVICE AND TEST SYSTEM INCLUDING THE SAME

(71) Applicant: Keysight Technologies, Inc., Santa Rosa, CA (US)

(72) Inventors: Ken Yawata, Musashino (JP); Hiroshi Nada, Hachioji (JP)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 16/773,383

(22) Filed: Jan. 27, 2020

(65) Prior Publication Data

US 2021/0231728 A1     Jul. 29, 2021

(51) Int. Cl.
| | | |
|---|---|---|
| *G01R 31/00* | (2006.01) | |
| *G01R 31/28* | (2006.01) | |
| *H02J 4/00* | (2006.01) | |

(52) U.S. Cl.
CPC ............ *G01R 31/2839* (2013.01); *H02J 4/00* (2013.01)

(58) Field of Classification Search
CPC ...... H02J 4/00; H02J 9/061; H02J 3/46; H02J 9/06; H02J 7/0026; H02J 7/0014; H02J 7/0018; H02M 3/285; H02M 3/156; H02M 3/157; H02M 3/158; H02M 3/1584; G01R 31/2839
See application file for complete search history.

(56) References Cited

U.S. PATENT DOCUMENTS

| | | | |
|---|---|---|---|
| 5,579,236 A | 11/1996 | Tamamura et al. | |
| 8,030,959 B2 * | 10/2011 | Franco | G01R 31/31721 324/762.01 |
| 8,233,299 B2 * | 7/2012 | Ahmad | H02M 3/1584 363/72 |
| 8,552,589 B2 | 10/2013 | Ghosh et al. | |
| 9,774,184 B2 * | 9/2017 | Tajima | H02J 1/108 |
| 2005/0008146 A1 * | 1/2005 | Chheda | G06F 1/263 379/413 |
| 2012/0248877 A1 * | 10/2012 | Tajima | H02J 1/08 307/71 |
| 2015/0293151 A1 * | 10/2015 | Yawata | G01R 19/00 324/126 |
| 2017/0358986 A1 * | 12/2017 | Jiang | H02M 3/1584 |
| 2018/0059172 A1 | 3/2018 | Pounds | |
| 2019/0173289 A1 * | 6/2019 | Kawamoto | H02J 4/00 |
| 2020/0059100 A1 * | 2/2020 | Kawamoto | H02J 13/00004 |

FOREIGN PATENT DOCUMENTS

| | | | |
|---|---|---|---|
| CN | 101820372 | * | 9/2010 |
| WO | 02/31943 A2 | | 4/2002 |

OTHER PUBLICATIONS

"SPI-Appnotes: Parallel Connections", Switching Power, Inc., Regulated D.C. Power, http://www.switchpwr.com, pp. 1-5.
(Continued)

*Primary Examiner* — Thang X Le

(57) ABSTRACT

A current supply device includes a multiplexed digital bus, an output terminal, and a group of power supplies connected in parallel between the multiplexed digital bus and the output terminal. The group of power supplies are controlled via the multiplexed digital bus such that a combined output current of the group of power supplies is applied to the output terminal.

11 Claims, 10 Drawing Sheets

(56) References Cited

OTHER PUBLICATIONS

"Cascading the Outputs of the NI PXIe-4138/4139", National Instruments, Feb. 3, 2015, http://www.ni.com/tutorial/52335/en/, pp. 1-5.
"1.2 A Programmable Device Power Supply with Integrated 16-Bit Level Setting DACs—AD5560", Analog Devices, 2008-2016, pp. 1-66.
"High Precision Source Measure Unit: Model 52400 Series", PXI Systems Alliance, pp. 1-4.
"Optimal SMU Response by Large Selectable Control Bandwidths for Capacitive Loads", Chroma ATE Inc., Oct. 2013, www.chromaus.com, pp. 1-4.

* cited by examiner

CURRENT SUPPLY DEVICE AND TEST SYSTEM INCLUDING THE SAME

BACKGROUND

The inventive concepts generally relate to current supply devices and to test systems including current supply devices.

In testing and other applications, it may be necessary to generate a current (such as a current applied to a device under test (DUT)) that exceeds the individual output capacities of available current supplies. As such, it may be necessary to connect two or more power supplies to supply the needed current level. The simplest method to create higher currents is to connect the available power supplies in parallel. A more elegant approach is to equip the supplies with control signals that allow for automatic control of output levels among the supplies. In this way, supplies can be controlled with a single master supply controlling one or more slave supplies. Multiple slave supplies can be configured to track the master, and the slaves can have the same output characteristics or can be configured to be proportional to the master.

One drawback of current systems is the time needed to manually reconfigure multiple power supplies each time a new DUT is tested. The time expended is especially burdensome in the master/slave configurations discussed above.

SUMMARY

According to an aspect of the inventive concepts, a current supply device is provided that includes a multiplexed digital bus, an output terminal, and a group of power supplies connected in parallel between the multiplexed digital bus and the output terminal. The group of power supplies are controlled via the multiplexed digital bus such that a combined output current of the group of power supplies is applied to the output terminal.

Each of the group of power supplies may be a source measurement unit (SMU).

The group of power supplies may be included in set of available power supplies connected to the multiplexed digital bus, and the set of available power supplies may be operationally interchangeable. Designation of the group of power supplies among the set of available power supplies may be controlled via the multiplexed digital bus.

The group of power supplies may include a master power supply and at least one slave power supply. The at least one slave power supply may be controlled based on feedback information received from the master power supply via the multiplexed digital bus.

The master power supply may be responsive to commands received on the multiplexed bus to operate in a voltage source mode, and the at least one slave power supply may be responsive to commands received on the multiplexed bus to operate in the voltage source mode. In this case, the feedback information may be indicative of a feedback voltage of the master power supply.

The master power supply may be responsive to commands received on the multiplexed bus to operate in a voltage source mode, and the at least one slave power supply may be responsive to commands received on the multiplexed bus to operate in a current source mode. In this case, the feedback information may be indicative of a feedback current of the master power supply.

Designation of the master power supply and the at least one slave power supply among the available set of power supplies may be controlled via the multiplexed digital bus.

The output terminal may be a first output terminal and the group of power supplies may be a first group of power supplies. The current supply device may further include a second output terminal, and a second group of power supplies connected in parallel between the multiplexed digital bus and the second output terminal. Each of the second group of power supplies may be controllable via the multiplexed digital bus such that a combined output current is applied to the second output terminal.

The first and second groups of power supplies may be included in a set of available power supplies connected to the multiplexed digital bus, and designation of the first group of power supplies among the set of available power supplies may be controlled via the multiplexed digital bus, and designation of the first group of power supplies among the set of available power supplies may be controlled via the multiplexed digital bus.

Adding and removing power supplies from among the available set of power supplies to the first and second groups may be controlled via the TDM digital bus.

The multiplexed digital bus may be a time-division multiplexed (TDM) digital bus.

The output terminal may be an output of a programmable switching array.

A functional block of at least two power supplies of the group of power supplies may be located on a same FPGA (Field Programmable Gate Array) platform or ASIC (Application Specific Integrated Circuits) platform.

According to another aspect of the inventive concepts, a test system is provided that includes a programmable switching array and a current supply device. The programmable switching array includes input terminals, output terminals, and an array of programmable switches configured for selectively connecting any one of the input terminals to any one of output terminals. The current supply device includes a multiplexed digital bus and a plurality of a power supplies connected in parallel between the multiplexed digital bus and the input terminals of the programmable switching array.

The plurality of power supplies may be source measurement units. The source measurement units may include a master source measurement unit and at least one slave source measurement unit that generate respective output currents that are combined by the programmable switching array. Further, the at least one slave source measurement unit may be controlled based on feedback information received from the master source measurement unit via the multiplexed digital bus. The feedback information may be indicative of a feedback voltage of the master source management unit or a feedback current of the master source management unit.

According to yet another aspect of the inventive concepts, a current supply device is provided that includes a multiplexed digital bus, and a plurality of a power supplies connected to the multiplexed digital bus. The plurality of a power supplies include a plurality of a master power supplies and a plurality of slave power supplies, and each of the plurality of a master power supplies controls at least one slave power supply via the multiplexed digital bus to perform an output current combining operation.

BRIEF DESCRIPTION OF THE DRAWINGS

The above and other aspects and features of the inventive concepts will become readily apparent from the detailed description that follows, with reference to the accompanying drawings, in which.

DETAILED DESCRIPTION

Throughout the drawings, like reference numbers are given to like elements in the various embodiments. In addition, as the discussion below progresses from one embodiment to the next, a detailed description of already described elements common to previous embodiments is not repeated to avoid redundancy.

Figure 1:
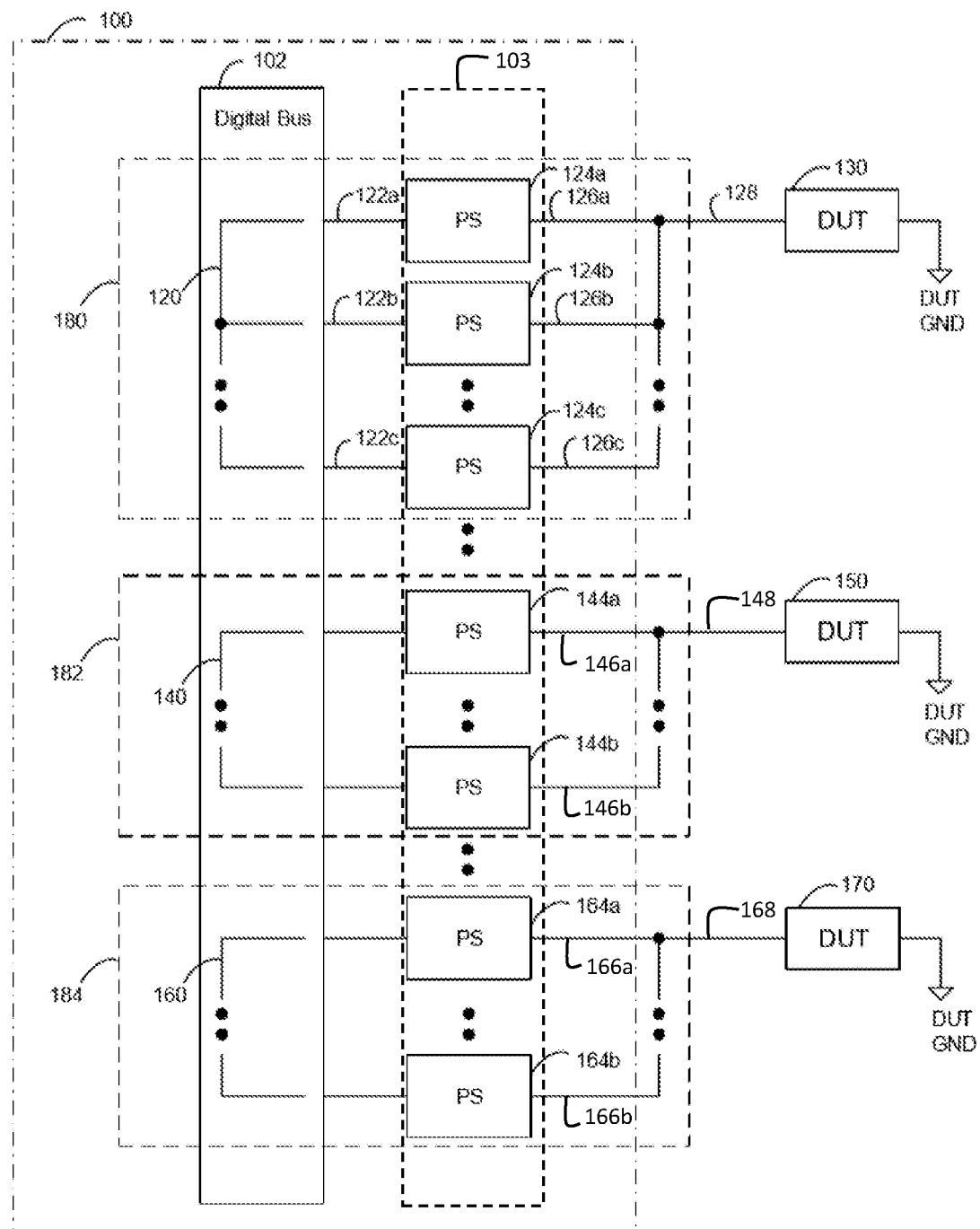
FIG. 1 is a block diagram illustrating a current supply device including a plurality of a power supplies according to an embodiment of the inventive concepts.

FIG. 1 is a schematic diagram of a test system including a current supply device 100 for reference in describing an embodiment of the inventive concepts.

Referring to FIG. 1, the current supply device 100 of this example includes a time-division-multiplex (TDM) digital bus 102 and plural power supplies (PSs) 124a, 124b, 124c, 144a, 144b, 164a and 164b. In the current embodiment, each of the power supplies constant current and/or a constant voltage. Separate ammeter and/or voltmeters (not shown) may also be provided to sense characteristics of a device under test (DUT) stressed by the outputs of the respective power supplies. In other embodiments, as will explained later with reference to specific examples (FIGS. 6, 7 and 8), each of the power supplies may be equipped with a current source and/or voltage source, as well as feedback and sensing circuitry for detecting an output current and/or output voltage of a DUT.

The interoperative relationship of the power supplies may be dynamically controlled through the TDM digital bus 102. For purposes of explanation, the power supplies coupled to the TDM digital bus 102 are referred to herein as "an available set 103 of power supplies" that are available to be utilized in the supply of current to one or more DUTs. Although seven power supplies are shown, the number of power supplies constituting the available set 103 of power supplies is not limited. Each power supply (PS) may be packaged as a printed circuit board (PCB) card configured to be plugged into a module (or rack or chassis) of a mainframe including the TDM digital bus 102. For example, the power supplies may be plugged into peripheral slots of the TDM digital bus 102. However, the inventive concepts are not limited in this manner.

The available set 103 of power supplies is illustrated in FIG. 1 as being grouped into supply groups 180, 182 and 184. In the example of FIG. 1, the supply group 180 includes power supply 124a having output 126a, power supply 124b having output 126b, and power supply 124c having output 126c. The supply group 182 includes power supply 144a having output 146a and power supply 144b having output 146b. The supply group 184 includes power supply 164a having output 166a and power supply 164b having output 166b. As shown, the power supplies of each supply group 180, 182 and 184 are connected in parallel between the TDM digital bus 102 and respective consolidated output terminals 128, 148 and 168. As will be explained in detail below, each supply group 180, 182 and 184 is controlled via the TDM digital bus 102 such that a combined output current is applied to the respective consolidated output terminals 128, 148 or 168.

Although three (3) supply groups 180, 182 and 184 are shown in FIG. 1, this number can be altered, and the embodiment is not limited to any given number of supply groups. Likewise, the number of power supplies within each group is not limited. In addition, it is not necessary that every power supply among the available set 103 of power supplies be contained within a supply group. For example, one or more power supplies among of the available set 103 of power supplies may be idle or independently operative to supply current to an output terminal. Further, the power supplies constituting a supply group need not be physically adjacent one another or in a same module.

FIG. 1 illustrates a test system in which the current supply device 100 supplies test currents to a plurality of devices under test (DUTs) 130, 150 and 170. In the example of FIG. 1, the outputs 126a, 126b and 126c of the supply group 180 are commonly coupled to the consolidated output terminal 128 to supply a combined current to the DUT 130. The outputs 146a and 146b of the supply group 180 are commonly coupled to the consolidated output terminal 148 to supply a combined current to the DUT 150. The outputs 166a and 166b of the supply group 180 are commonly coupled to the consolidated output terminal 168 to supply a combined current to the DUT 170.

As shown in FIG. 1, each DUT may be connected to a DUT ground (DUT GND).

It is noted that the connection from the output of each power supply to a corresponding DUT is described above as a single integrated connection line for simplicity. However, the embodiment is not limited in this fashion. For example, the connection may instead be configured as a Kelvin connection or the like having separate sense and source wires. Further, the wires may be implemented as coaxial cables and/or triaxial cables.

The TDM digital bus 102 of the example of this embodiment carries out time division multiplexing in which data or information from connected devices is allocated to given time slots. For example, the TDM digital bus 102 may conform to PXIe standards. In this case, a relatively high bandwidth of up to 8 GB/s may be dedicated to each peripheral slot of the TDM digital bus 102, and data may be rapidly communicated from any node connected to the TDM digital bus 102.

In order to transmit and receive information such as data and/or commands, each of the available set 103 of power supplies includes at least one connection line in communication with the TDM digital bus 102. For example, in the embodiment of FIG. 1, the power supplies 124a to 124c of supply group 180 are shown as being connected to the TDM digital bus 102 via connection lines 122a to 122c. In addition to communicating with an external controller, the power supplies 124a to 124c may communicate with one another through a virtual connection line 120 of the TDM digital bus 102. In this configuration, as will be explained in more detail later, a magnitude of a current output to the DUT 130 may be controlled. As examples, information transmitted over the TDM digital bus 102 may include data indicative of a detected output voltage or output current of each power supply, and commands for an internal controller (not illustrated) of the power supplies.

Similarly, in order to control the magnitude of currents supplied to the DUTs 150 and 170, the power supplies 144a and 144b of the supply group 182 are connected to a virtual connection line 140 of the TDM digital bus 102, and power supplies 164a and 164b of the supply group 184 are connected to a virtual connection line 160 of the digital line 102.

Figure 2:
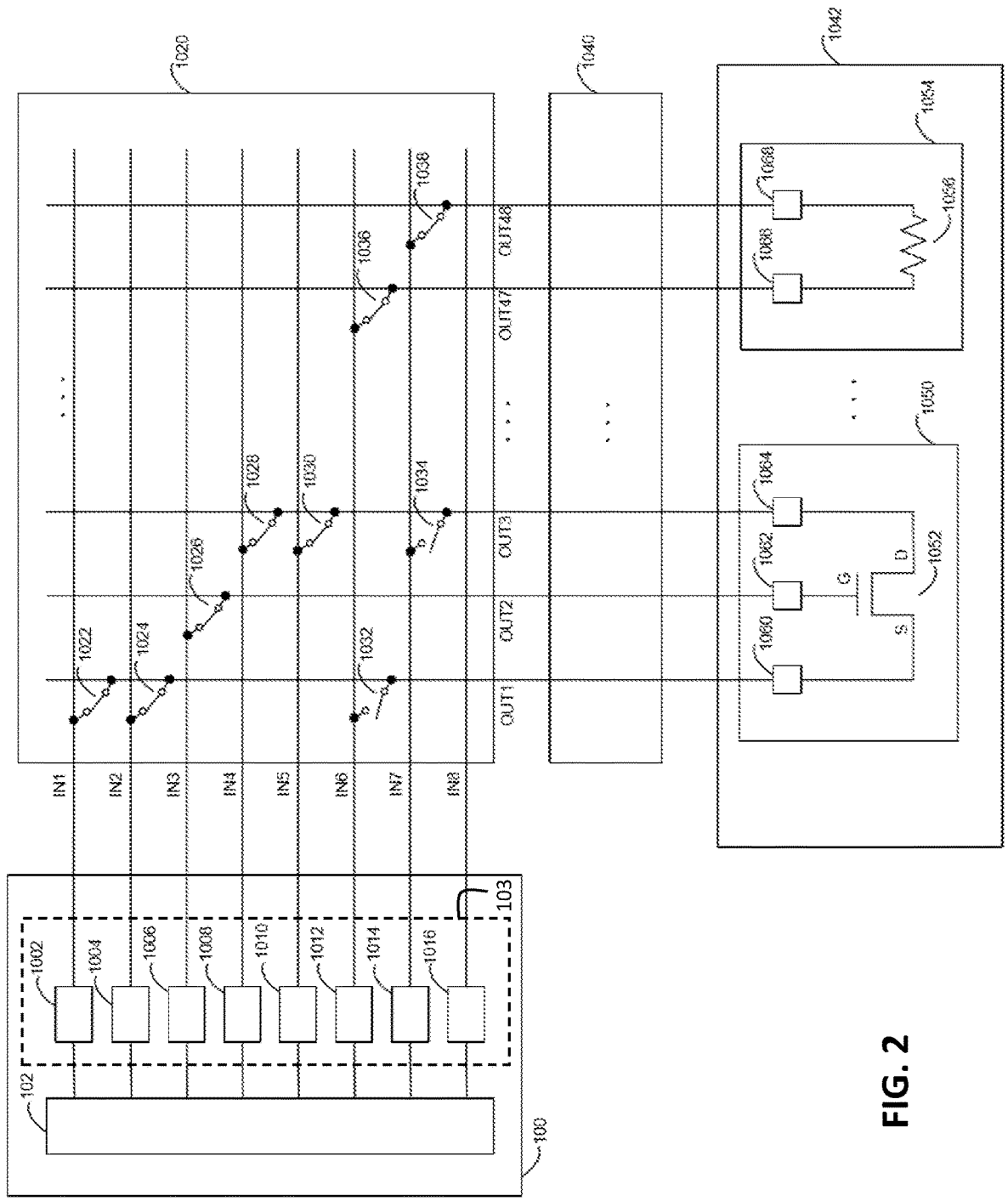
FIG. 2 is a illustrates example of a test setup for reference in further describing embodiments of the inventive concepts.

As will be demonstrated by example with reference to FIG. 2, the TDM digital bus 102 allows for a high degree of flexibility and simplicity in system setup and system reconfiguration. It is noted here, however, that the inventive concepts are not limited to the use of a TDM digital bus. Instead, other types of multiplexed buses may be utilized, such as a frequency-division multiplexed (FDM) bus.

FIG. 2 illustrates an exemplary test setup. In the figure, reference number 1042 denotes a die including (TEGs) 1050 and 1054, each of which may be considered a DUT. TEG 1050 includes a field effect transistor (FET) 1052 having a source S, gate G and drain D respectively connected to pads 1060, 1062 and 1064. TEG 1054 includes a resistive element 1056 connected to pads 1066 and 1068.

Reference number 1040 of FIG. 2 denotes a wafer probe device connected between the pads of the die 1042 and a switching matrix 1020. The wafer probe device 1040 may be configured to automatically transport a wafer having one or more DUTs mounted thereon and automatically cause measurement needles thereof to touchdown on selected pads of a selected die on the wafer. It is noted that other devices may be used instead of a wafer probe device. For example, an automatic integrated circuit (IC) handler can be used to carry out measurements on an IC package level rather than a wafer level.

Reference number 100 of FIG. 2 is a current supply device including a TDM digital bus 102 and an available set 103 of power supplies 1002, 1004, 1006, 1008, 1010, 1012, 1014 and 1016. As mentioned previously, each power supply may be packaged as a printed circuit board (PCB) card configured and plugged into a rack or chassis of the current supply device 100. For explanation purposes, it is assumed here that the power supplies are arranged in slots in the order shown in FIG. 2. Further, the power supplies 1002 through 1016 may be operationally interchangeable.

The switching matrix 1020 of this example is configured of an array of programmable relays such that a connection is possible between any of eight inputs (IN1, IN2, ..., IN8) to any of 48 outputs (OUT1, OUT2, ..., OUT48). For purposes of explanation, FIG. 2 depicts a relay 1022 connecting IN1 and OUT1, a relay 1024 connecting IN2 and OUT1, a relay 1026 connecting IN3 and OUT2, a relay 1028 connecting IN4 and OUT3, a relay 1030 connecting I5 and OUT3, a relay 1032 connecting IN6 and OUT1, a relay 1034 connecting IN7 and OUT3, a relay 1036 connecting IN6 and OUT47, and a relay 1038 connecting IN7 and OUT48. Additionally, FIG. 2 illustrates a case wherein the relays 1032 and 1034 are open and the remaining relays are closed.

In the example of FIG. 2, outputs of the power supplies 1002 to 1016 are respectively coupled to inputs IN1 to IN8 of the switching matrix 1020. Further, outputs OUT1, OUT2 and OUT3 of the switching matrix are respectively coupled to the pads 1060, 1062 and 1064 of the TEG 1050 by the wafer probe device 1040. Also, outputs OUT47 and OUT48 are respectively coupled to the pads 1066 and 1068 of the TEG 1054 by the wafer probe device 1040.

Assume, for example, that test parameters dictate that a test current of 180 mA is to be applied to the pads 1060 and 1064 of the die 1042, and a test current of 80 mA is to be applied to the pads 1062, 1066 and 1068 of the die 1042. Further assume, for example, that each of the power supplies 1002 to 1016 has a maximum output current of 100 mA. Referring to FIG. 2, the power supplies 1002 and 1004 of the current supply device 100 may be configured through the TDM digital bus 102 to constitute a first supply group having a combined maximum output current of 200 mA. The power supplies 1002 and 1004 are controlled through the TDM digital bus 102 such that their combined output currents are the required 180 mA. Combining the output currents is realized by closing the relays 1022 and 1024. As a result, 180 mA is generated from output OUT1 of the switching matrix 1020. In this case, the output OUT1 may be considered a consolidated output terminal (e.g., like terminal 128 of FIG. 1) combining the current outputs of the power supplies 1002 and 1004. This combined current is applied to the pad 1060 of the TEG 1050 via the wafer probe 1040.

In a similar manner, the power supplies 1008 and 1010 may be configured through the TDM bus 102 to constitute a second supply group, and the required combined test current of 180 mA may be generated at output OUT3 of the switching matrix 1020 and supplied to the pad 1064 of the TEG 1050 via the wafer probe 1040.

In the meantime, power supplies 1006, 1012 and 1014 are not configured to operate within a supply group, and instead these power supplies operate independently to supply respective test currents. In particular, given the previous assumed test parameters, power supply 1006 is controlled through the TDM digital bus 102 to supply a test current of 80 mA to the pad 1062 of the TEG 1050 through the relay 1026 and output OUT2 of the switching matrix 1020. Power supply 1012 is controlled through the TDM digital bus 102 to supply a test current of 80 mA to the pad 1066 of the TEG 1054 through the relay 1036 and output OUT47 of the switching matrix 1020. Power supply 1014 is controlled through the TDM digital bus 102 to supply a test current of 80 mA to the pad 1068 of the TEG 1054 through the relay 1038 and output OUT48 of the switching matrix 1020. Further in this example, power supply 1016 is idle (not used).

Now assume a change in test parameters in which another die is tested that requires a 250 mA test current be generated at outputs OUT1 and OUT3 of the switching matrix 1020. In this case, still referring to FIG. 2, the power supplies 1002, 1004 and 1012 of the current supply device 100 may be configured through the TDM digital bus 102 to constitute a first supply group having a combined maximum output current of 300 mA. The power supplies 1002, 1004 and 1012 are controlled through the TDM digital bus 102 such that their combined output currents are the required 250 mA. Combining the output currents is realized by closing the relay 1032 (and opening relay 1036). As a result, 250 mA is generated from output OUT1 of the switching matrix 1020.

Similarly, the power supplies 1008, 1010 and 1014 may be configured through the TDM bus 102 to constitute a second supply group, and the required combined test current of 250 mA may be generated at output OUT3 of the switching matrix 1020. Here, relay 1034 is closed, and relay 1038 is open.

In this manner, the second die having different test parameters can be tested without manually changing or rewiring the test equipment setup.

Note that, in the example above, the power supplies 1002, 1004 and 1012 of the first supply group are not all directly adjacent one another, and the power supplies 1008, 1010 and 1014 are not all directly adjacent one another.

Figure 3:
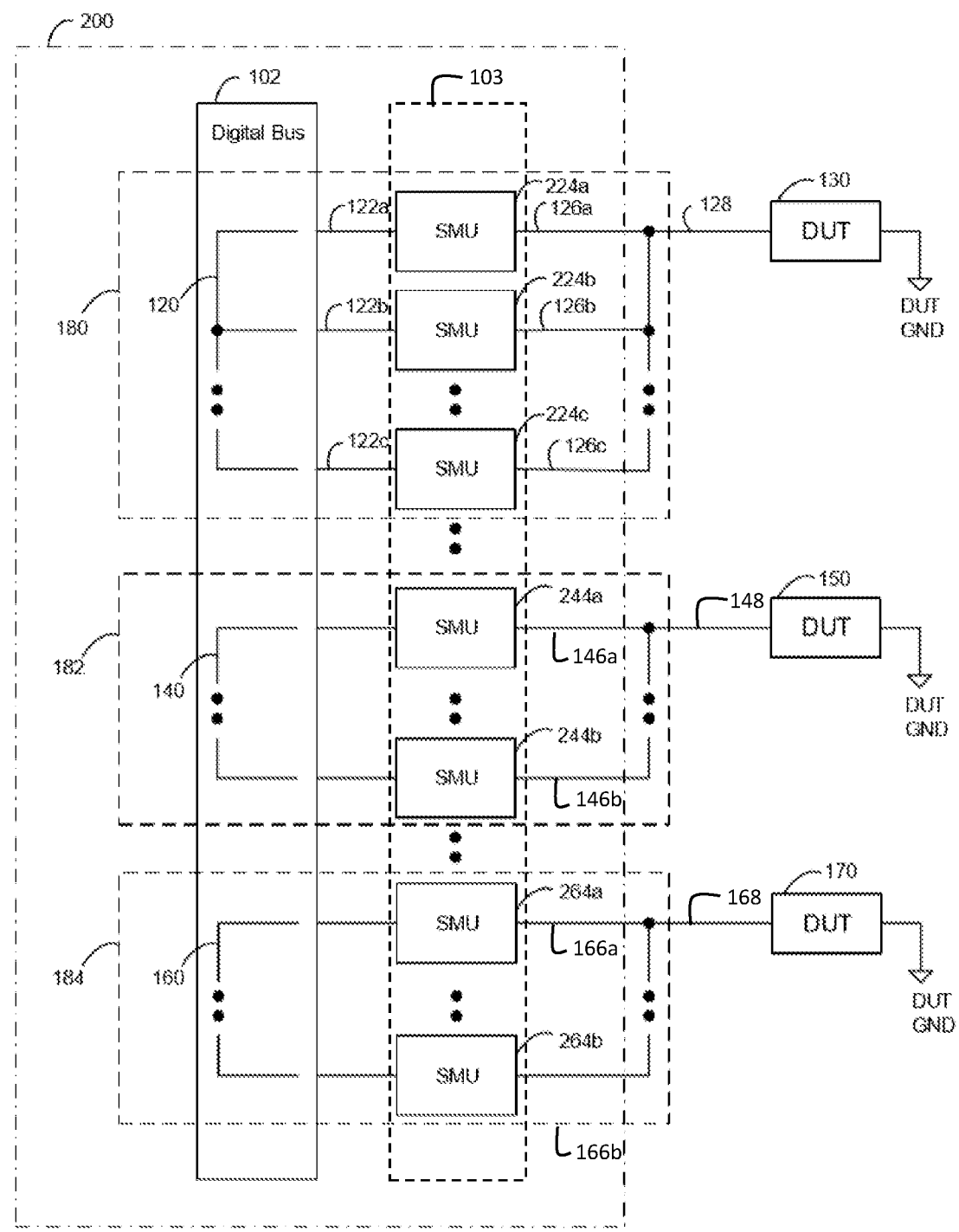
FIG. 3 is a block diagram illustrating a current supply device including a plurality of source measurement units (SMUs) according to another embodiment of the inventive concepts.

FIG. 3 is a schematic diagram of a current supply device 200 for reference in describing another embodiment of the inventive concepts.

The current supply device 200 has a similar configuration as the current supply device 100 described above in connection with FIG. 1, with the primary exception being that the power supplies of the embodiment of FIG. 1 are source measurement (or measure) units (SMUs) in the embodiment of FIG. 3. An SMU is a device that integrates the capabilities of a power supply with those of a digital multimeter in a single instrument. The SMU is typically equipped with an internal controller that controls operations of the SMU in accordance with data and commands received via an external automated test system controller. The automated test system controller may, for example, be implemented as software running in a general-purpose computing system or a special-purpose computing system.

Figure 4:
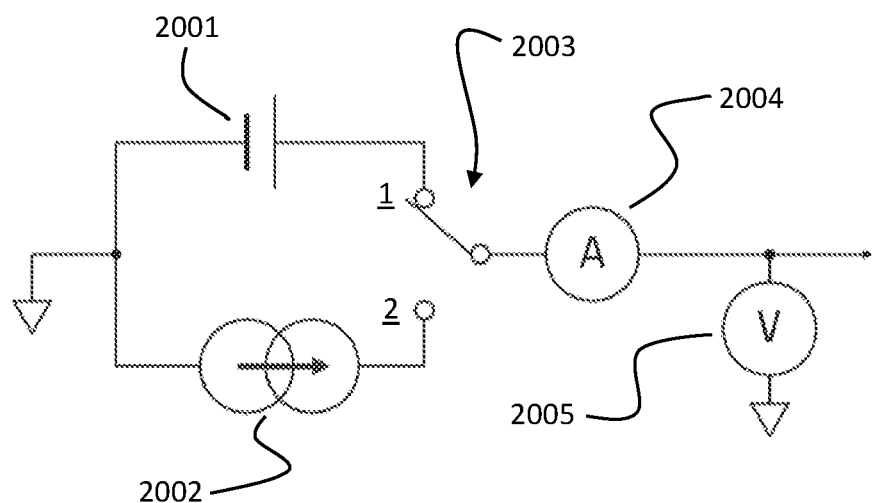
FIG. 4 is a schematic circuit diagram for reference in describing an SMU.

FIG. 4 is a simplified schematic diagram of an SMT which can force voltage or current and simultaneously measure (sense) voltage and/or current. In the figure, reference number 2001 denotes a voltage source, reference number 2002 denotes a current source, reference number 2003 denotes a switch, reference number 2004 denotes an ammeter, and reference number 2005 denotes a voltmeter. In switch position 1 of FIG. 4, the SMU sources voltage which may be referred to herein as a force voltage (FV) mode. In switch position 2 of FIG. 4, the WU sources current which may be referred to herein as a force current (FI) mode. Separately, an SMU may have the ability to specify a compliance setting. The compliance setting is opposite to that of the source setting of the SMU (that is, current compliance when the SMU is in voltage source mode and voltage compliance when the WU is in current source mode). When an SMU reaches compliance, it acts as a constant voltage or current source.

One example of an SMU is described in U.S. Pat. No. 5,579,236 by Tamamura et al. and entitled "Voltage/Current Measuring Unit and Method", the disclosure of which is incorporated herein by reference in its entirety.

Referring back to FIG. 3, the current supply device 200 of this embodiment includes a TDM digital bus 102 and an available set 103 of SMUs 224a, 224b, 224c, 244a, 244b, 264a and 264b. Each SMU is operatively coupled to the TDM digital bus 102, whereby data and commands may be transmitted to the SMU from the previously mentioned automated test system controller.

Like the embodiment of FIG. 1, the embodiment of FIG. 3 is depicted as having supply groups 180, 182 and 184. Supply group 180 includes SMUs 224a, 224b and 224c. Supply group 182 includes SMUs 244a and 244b. Supply group 184 includes SMUs 264a and 264b. As with the embodiment of FIGS. 1 and 2, the supply groups are established through the TDM digital bus 102 when a required test current exceeds the maximum output current of the individual SMUs.

Figure 5:
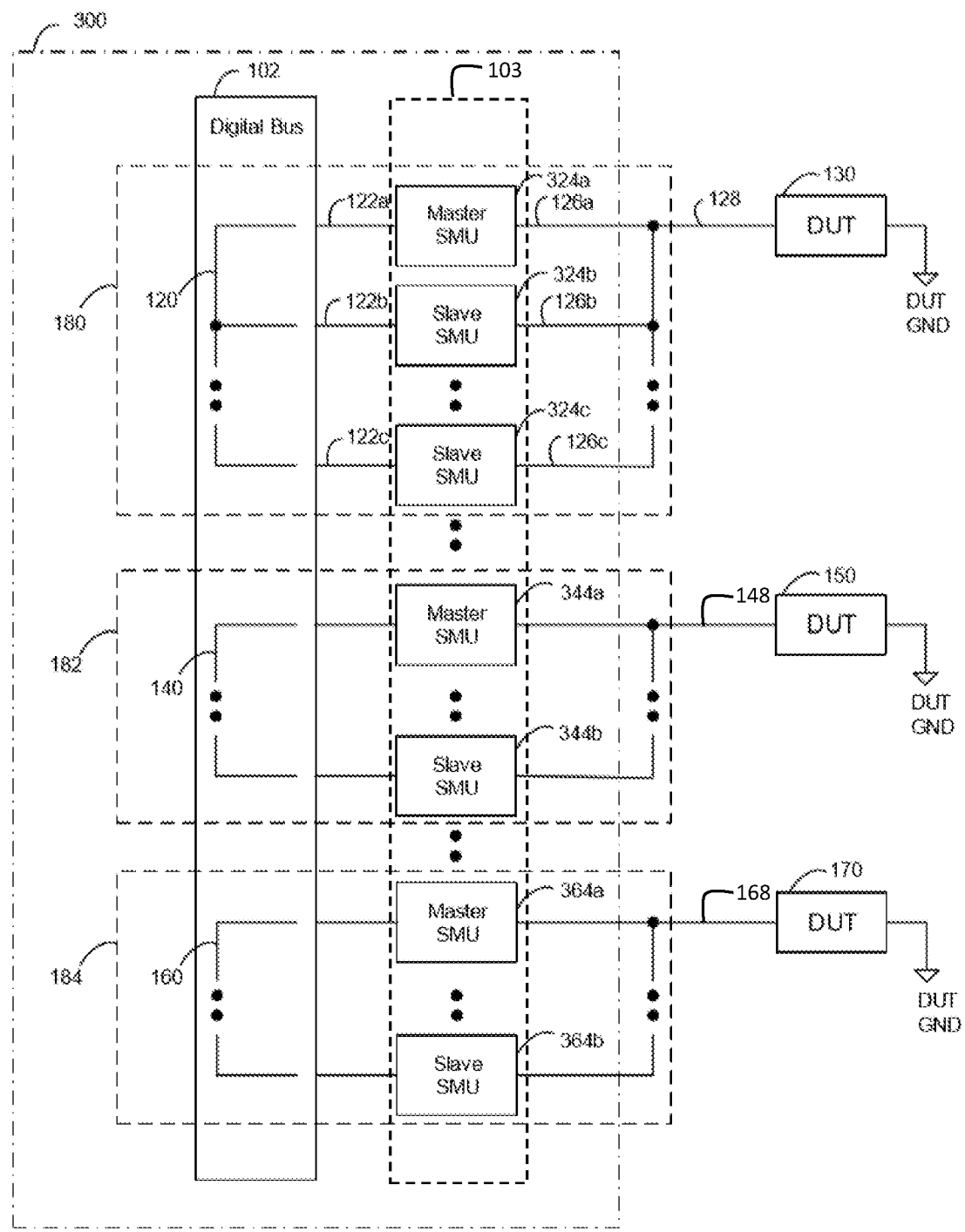
FIG. 5 is a block diagram illustrating a current supply device including master and slave SMUs according to another embodiment of the inventive concepts.

FIG. 5 is a schematic diagram of a current supply device 300 for reference in describing another embodiment of the inventive concepts.

In the case where multiple SMUs are combined to obtain a desired current, it may be desirable to synchronize the SMUs by defining one as a master and the other(s) as a slave. Briefly, the master SMU is responsible for signaling the slave SMU to initiate operations.

The current supply device 300 of the embodiment of FIG. 5 has a similar configuration as that of the embodiment of FIG. 3, except that each of the plurality of supply groups 180, 182, and 184 is configured by one master SMU and one or more slave SMUs. In particular, referring to FIG. 5, the supply group 180 includes a master SMU 324a and slave SMUs 324b and 324c, the supply group 182 includes a master SMU 344a and a slave SMU 344b, and the supply group 184 includes a master SMU 364a and a slave SMU 364b. Like the SMUs of the embodiment of FIG. 3, the SMUs of the embodiment of FIG. 4 are connected in parallel between the TDM digital bus 102 and the DUTs 130, 150 and 170.

In an embodiment, the SMUs of FIG. 5 are operationally interchangeable, and all of the available set 103 of SMUs are capable of functioning as a master SMU. In another embodiment, only designated ones of the available set of SMUs is capable of functioning as a master SMU.

The master SMU and slave SMU(s) may operate in tandem such that a feedback amount of current or voltage sensed by the master SMU may be passed to one or more slave SMUs on the slave side, and each slave SMU is controlled to operate as a voltage source or current source based on the feedback amount received from the master SMU. By communicating through the TDM digital bus 102, the master/slave functionality of each SMU may be flexibly designated or undesignated when transitioning from one DUT measurement setup to a next DUT measurement setup.

In embodiments, a supply group constituted by a master SMU and one or more slave SMUs may operate in one of two operating modes. One operating mode is referred to here as a Force Voltage/Force Voltage (FVFV) mode in which the master SMU and the slave SMU(s) operate together in a voltage source mode. The other operating mode is referred to as a Force Voltage/Force Current (FVFC) mode in which the master SMU operates in a voltage source mode and the slave SMU operates in a current source mode.

Figure 6:
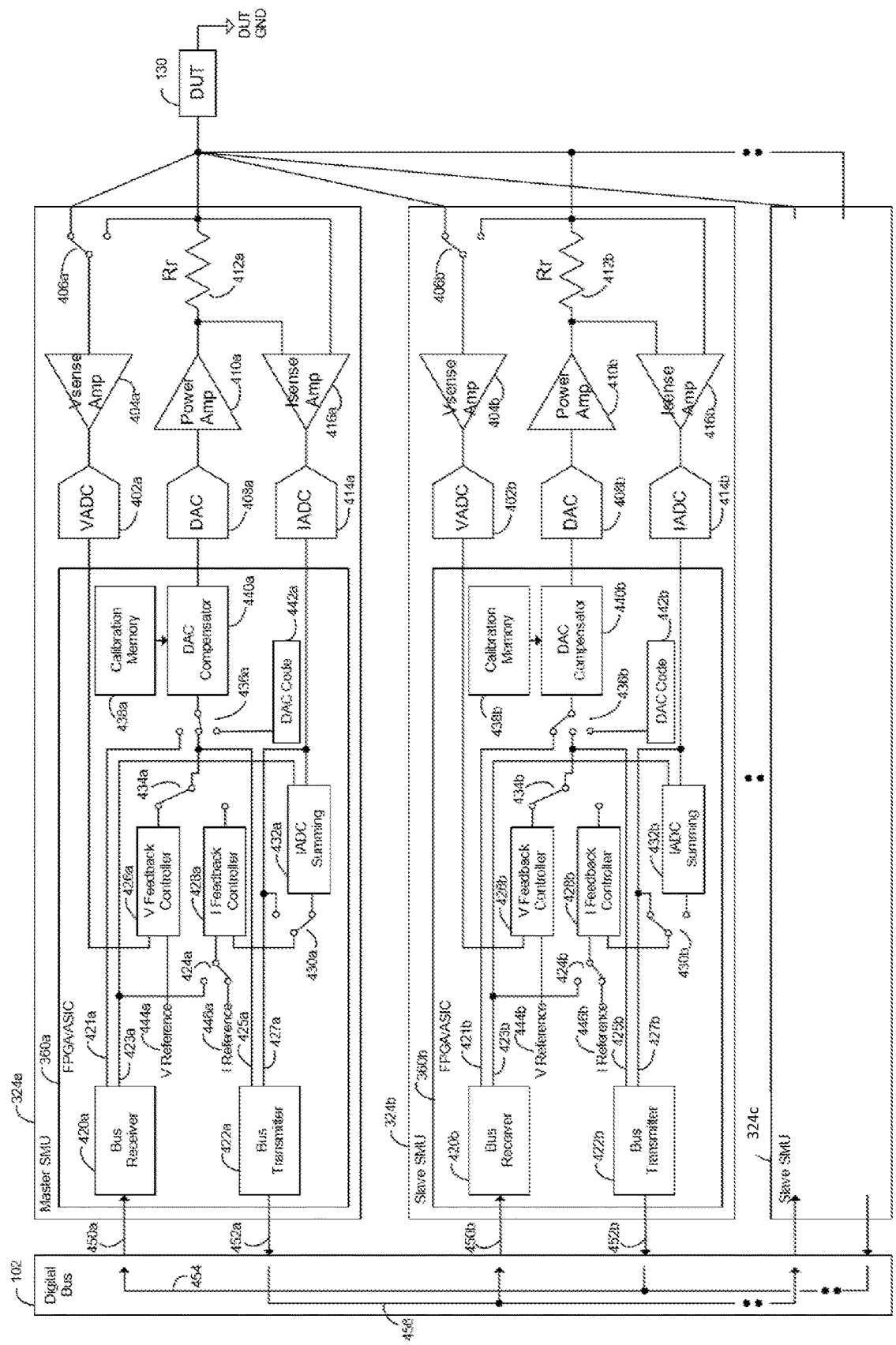
FIGS. 6, 7 and 8 are a more detailed block diagrams of a master SMU and a slave SMU according to other embodiments of the inventive concepts.

FIG. 6 is a more detailed diagram of an example of SMUs of the supply group 180 of FIG. 4 according to an embodiment of the inventive concepts. In particular, FIG. 5 illustrates a master SMU 324a and a slave SMU 324b. These devices will be described in the context of operating in the FVFV mode.

First, the configuration of the master SMU 324a will be described.

Referring to FIG. 6, reference number 360a denotes a functional block that may be configured on a FPGA (Field Programmable Gate Array) platform or ASIC (Application Specific Integrated Circuits) platform by hardware, software, or a combination of hardware and software. The functional block 360a is operatively connected between one or more transmission/reception slots on the TDM digital bus 102 and digital/analog conversion circuitry as described next.

In addition to the functional block 360a, the SMU 324a of this example includes a digital-to-analog converter (DAC) 408a which sets an analog voltage according to the digital output of a DAC compensator 440a of the functional block 360a. A power amplifier (power amp) 410a amplifies the analog voltage from the DAC 408a, and applies the amplified voltage to a range resistor Rr 412a which constitutes an output terminal of the master SMU 324a. A local/remote switch 406a selects either the output terminal of the master SMU or a terminal of the DUT 130 as a sense point of a voltage sense amplifier 404a. The voltage sense (Vsense) amplifier 404a detects a voltage of the sense point, and a V-analog-to-digital converter (VADC) 402a generates a digital signal indicative of the sensed voltage output by the Vsense amplifier 404a. A current sense (Isense) amplifier 416a detects a voltage across the range resistor Rr 412a to thereby determine an output current of the master SMU 324a, and an I-analog-to-digital converter (IADC) 414a converts an analog output of the Isense amplifier 416a to a digital signal indicative of the output current.

Still referring to FIG. 6, the functional block 360a of the SMU 324a will now be described. As shown, functional block 360a includes a data transmitter (bus transmitter) 422a for transmitting information to a bus line 456 of the TDM digital bus 102, and a data receiver (bus receiver) 420a for receiving information from a bus line 454 of the TDM digital bus 102.

The SMU 324a further includes a controller for voltage feedback control (V feedback controller) 426a operative in a voltage supply mode, and a controller for current feedback control (I feedback controller) 428a operative in a current supply mode. As mentioned previously, in this example the master SMU and slave SMU(s) are operating in the FVFV mode, and accordingly, the SMU 324a is operating in the voltage source mode. For this reason, an FV/FI switch (FV/FI switch) 434a for selecting either an output of the V feedback controller 426a or an output of the I feedback controller 428a is shown in FIG. 6 as selecting the output of the V feedback controller 426a.

The V feedback controller receives as inputs a signal indicative of a reference voltage (V reference) 444a and the output from the VADC 402a described earlier. The I feedback controller receives as inputs signals selected by an IREF switch 424a and an IADC measurement (meas) switch 430a. The IREF switch 424a selects either a current amount to the I feedback controller from the data receiver 420a or a signal indicative of a current reference (I reference) 446a. The IADC meas switch 430a selects either a feedback signal output from the IADC 414a described previously or the output of an IDAC adder (IDAC summing) 432a which adds the output of the IADC 414a and a current value from the data receiver 420a. The SMU 324a further includes, a DAC code generation circuit (DAC code) 442a for outputting a DAC code used for calibration, a DAC data source switch 436a for selecting a DAC data source from any one of the data receiver 420a, the FV/FI switch 434a, or the DAC code 442a, a calibration memory (calibration memory) 438a for storing a correction coefficient of the calibration results, and a DAC compensator (DAC compensator) 440a that can compensate/adjust a DAC control value based on a coefficient in the calibration memory.

Here, a wire 425a for inputting data relating to voltage and a wire 427a for inputting data relating to current are provided on the data transmitter 422a. Additionally, a wire 421a for inputting data relating to voltage and a wire 423a for inputting data relating to current are provided on the data receiver 420a. However, the provision of the two wires 425a and 427a at the output of the data transmitter 422a and the two wires 421a and 423a at the input of the data receiver 420a are merely presented as an example, and the embodiment is not limited in this fashion and can be realized in various forms of interconnection to and from the data transmitter 422a and data receiver 420a.

Under control of a controller (not shown) of the master SMU 324a, the master SMU 324a is set and operates in the FV mode as follows. As previously stated, the FV/FI switch 434a is set to select the output from the V feedback controller 426a. In addition, the DAC data source switch 436a is set to select the output FV/FI switch 434a. In this manner, the output of the V feedback controller 426a is applied to DAC data source switch 436a at the input of the DAC compensator 440a. In the example of FIG. 6, the Local/Remote switch 406a is set on the Remote side to sense the voltage at or near the DUT 130. The settings of the remaining switches are immaterial since the master SMU 324a is operating in the FV mode.

In operation, the voltage at or near the DUT 130 is sensed by the Vsense amp 404a, and a corresponding digital value generated by the VADC 402a is fed back to the V feedback controller 426a. The V feedback controller 426a calibrates the corresponding digital value with reference to the V Reference 444a, and the DAC compensator 440a adjusts an output voltage value applied to the DAC 408a based on the calibration result (referred to here as a control DAC value). An analog signal corresponding to the adjusted output voltage value is generated and output by the DAC 408a, and then amplified by the power amp 410a.

In addition to being applied to the DAC compensator 440a, the control DAC value output from the V feedback controller 426a is output to the TDM digital bus 102 via the line 425a, the data transmitter 422a, and the connection line 452a. From there, the control DAC value is transmitted to the data receivers (420b, and the like) of the slave SMU(s) of the same supply group.

To summarize, the master SMU 324a calculates a difference, that is, an error value, between a control target value (V Reference) and a feedback voltage measured by the master SMU 324a. The V feedback controller 426a adjusts a control amount to minimize the error value. The V feedback controller 426a can be realized, for example, by proportional-integral (PI) control, proportional-integral-derivative (PID) control, or the like.

Next, the operation of the slave SMU(s) will be described using the slave SMU 324b of FIG. 6 as an example. As can be seen in FIG. 6, the slave SMU 324b may be structurally identical to the master SMU 324a, and the two SMUs may be functionally interchangeable. Indeed, the slave SMU 324b may designated as a master SMU and the master SUM 324a may be designated as a slave SMU under control of automated test system controller. As such, like elements making up the master SMU 324a and the slave SMU 324b are identified in FIG. 6 with the same reference numbers (changing "a" to "b"), and only the operational distinctions of the slave SMU 324b relative to the previously described master SMU 324a are highlighted below.

The slave SMU 324b of this example operates in the FV mode and is set as follows under control of an internal controller (not shown). In contrast to the master SMU 324a, the DAC data source switch 436b of the slave SMU 324b is set to select the data receiver 420b. As such, the control DAC value transmitted on the TDM digital bus 102 from the master SMU 324a is input to the DAC compensator 440b of the slave SMU 324b via the connection line 450b, the data receiver 420b and the line 421b. The DAC compensator 440b controls the DAC 408b based on the control DAC value received from the master SMU 324a as described previously, and a corresponding voltage is generated and output by a DAC 408b. With this configuration, a voltage equal to the output voltage of the master SMU 324a may also be output from the slave SMU 324b, and in this manner stable current sharing can be realized. It is noted that the remaining switch positions and operations of the slave SMU 324b are the same as those of the master SMU 324a described above.

Manufacturing variations may result in different operating characteristics of the DAC and Power Amp of each SMU. As such, even if the same control value is applied to the DACs of master SMU and slave SMU(s) of a supply group, different output voltages may result. This is disadvantageous because differing output voltages can result in current from one SMU to another SMU in the supply group, which in turn can reduce the current applied to the DUT.

An embodiment for reducing a difference in SMU output voltage between the master and slave(s) is described next. Still referring to FIG. 6, the DAC Code 442a is selected by the DAC data source switch 436a. Through this setting, the DAC compensator 440a is disconnected from the feedback loop. Next, in the DAC compensator 440a, the input DAC value is set to operate with a gain parameter set to 1 and the offset parameter set to 0. Next, 0% of full scale, that is, a code 0, is generated from the DAC code 442a, and the result of measuring the output voltage value of the SMU at that time with the VADC 402a is transmitted to an external computer connected to the TDM digital bus 102 via the data transmitter 422a and stored as a variable A. Next, a 80% of full scale code is generated from the DAC Code 442a using the same procedure, and the result of measuring the output voltage value of the SMU at that time with the VADC 402a is transmitted to the external computer connected to the TDM digital bus 102 via the data transmitter 422a and stored as a variable B. Next, the variable A is sent from the external computer to the SMU 324a and stored as an offset parameter in the calibration memory 438a. Further, (variable B−variable A)/0.8 is calculated on the external computer, sent to the SMU 324a, and stored as a gain parameter in the calibration memory 438a. In this manner, the SMU 438a can correct the input DAC value using the gain parameter and the offset parameter with the DAC compensator 440a based on the information in the calibration memory 438a.

Furthermore, a total current flowing from the combination of SMUs to the DUT 130 can be obtained by adding together the IADC measurement values of the master SMU and the slave SMU(s). In that case, the slave SMU sends the digital value of the current value of the IADC (414b, and the like) to the master SMU 324a via the TDM digital bus 102 using an unused data transmitter (422b, and the like) and a line 427b. The master SMU 324a stores the current value measured by each slave SMU received by the data receiver 420a in the IADC Summing 432a via line 423a. This can be done by adding the digital value of the current measured value of its own IADC 414a with the IADC Summing 432a.

Next, a case where the master SMU and slave SMU(s) operates in the FVFI mode will be described with reference to FIG. 7. Briefly, in this operation mode, the master SMU 324a is operated with voltage feedback control (as in FIG. 6), and a detected value indicative of current is transmitted to the SMU(s) via the TDM digital bus. Each slave SMU operates with current feedback control (in contrast to FIG. 6) for controlling a current measurement value there using the current value of the master SMU received via the TDM digital bus.

Figure 7:
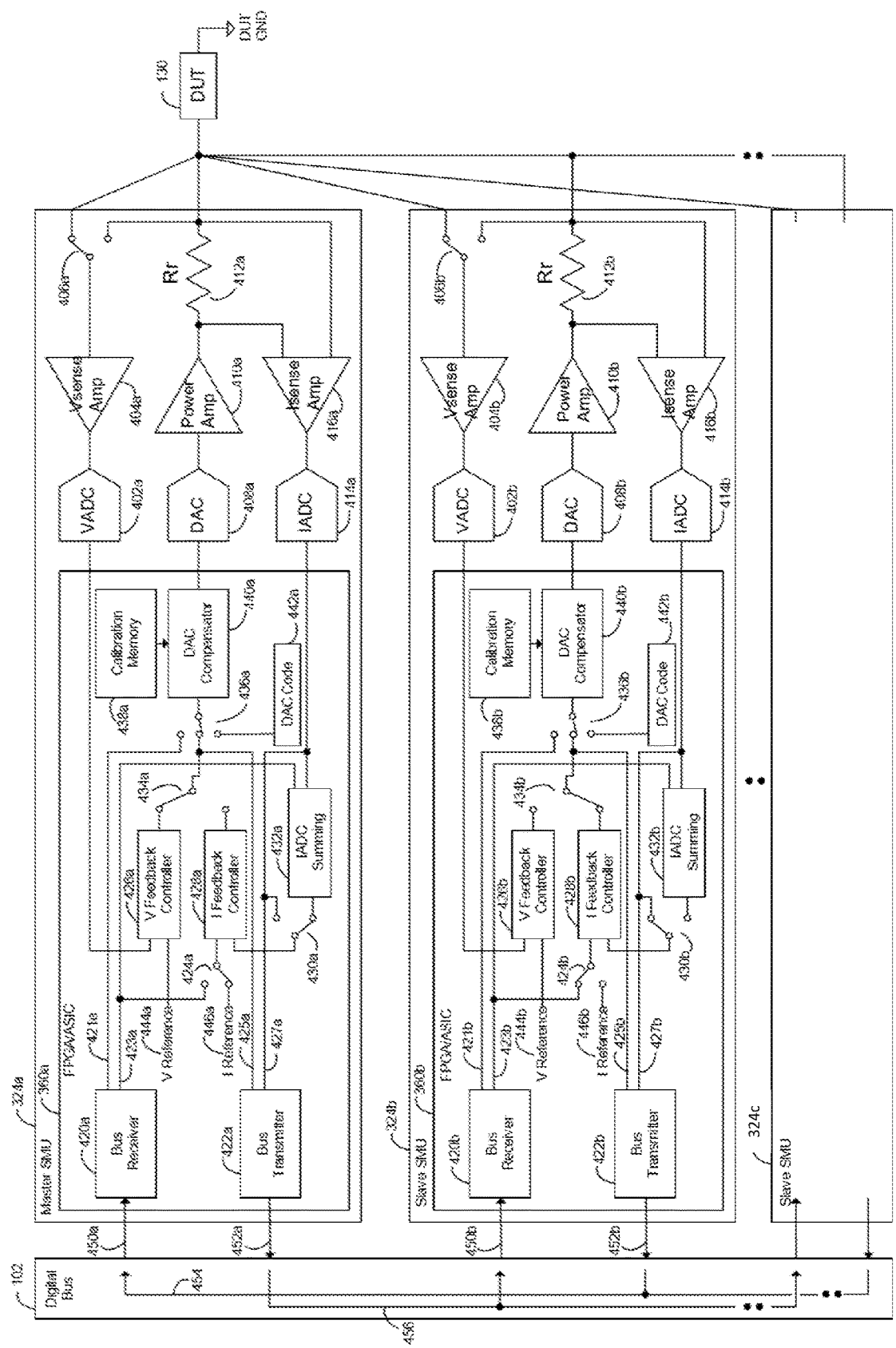

Structurally, the master SMU 324a and slave SMU 324b of FIG. 7 are the same as those of previously described FIG. 6. Further, the master SMU 324a of FIG. 7 operates in the same voltage source mode as described in connection with FIG. 6, and thus a detailed description thereof is omitted here to avoid redundancy. However, the master SMU 324a of FIG. 7 does operatively differ from that of FIG. 6 in that it transmits a sensed current value on the TDM digital bus 102 to the slave SMU 324b, rather than the control ADC value. This is because, in the FVFI mode, the slave SMU 324b operates in a current source mode with current feedback control. In particular, the master SMU 324a transmits a digital value of the current from the IADC 414a, which is a digital value of the current flowing through the range resistor 412a, via the data transmitter 422a, the line 427a, and the TDM digital bus 102 to the slave SMUs (324b, and the like) belonging to the same supply group.

Next, still referring to FIG. 7, an operation of the slave SMU 324b is described as an example. In order to operate in the FI mode and process the current measurement value from the master SMU 324a as a feedback reference value, the IADC Meas switch 430b is set to select the output of the IADC 414b, the IREF switch 424b is set to select the data receiver 420b via a line 423b, a FV/FI switch 434b is set to select an I feedback controller 428b, and the DAC data source switch 436b is set to select the FV/FI switch 434b. Note that in the example of FIG. 7, the Local/Remote switch 406b is set on the Remote side to sense the voltage at or near the DUT 130.

In operation, the data receiver 420b of the slave SMU 324b receives the current measurement result of the master SMU 324a, and applies the result as an input to the I feedback controller 428b. The current measurement result, which constitutes an output current target value of the slave SMU 324b, is compared with a sensed output current fed back from the IADC 414b, and an resultant control value output by the I feedback controller 428b of the slave SMU 324b is used compensate an input value of the DAC 408b. In this manner, the slave SMU 324b carries out current feedback control to adjusts the output current to match the current measurement result received from the master SMU 324a.

Figure 8:
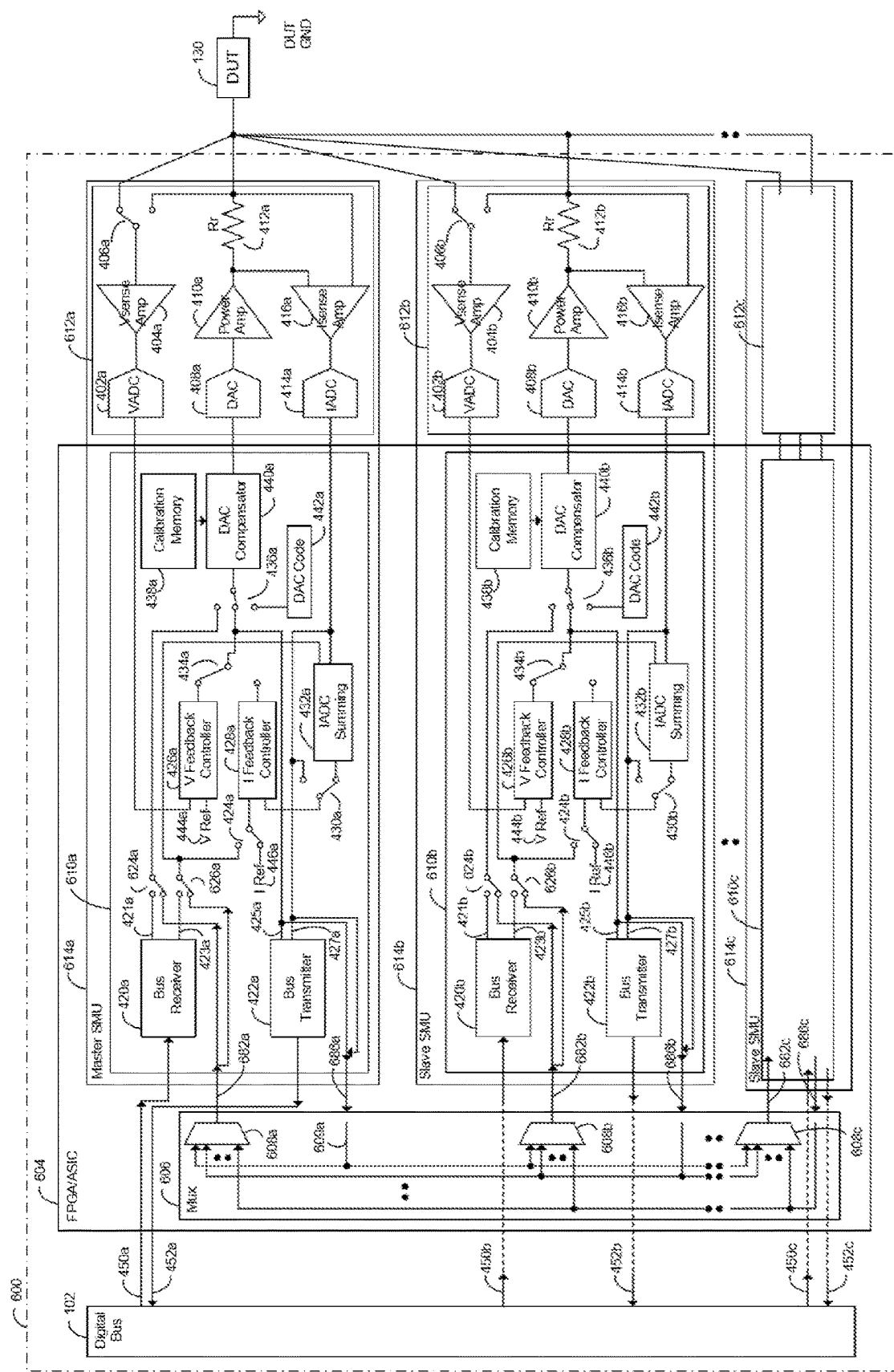

FIG. 8 is a schematic diagram for reference is describing a current supply device 600 according to another embodiment of the inventive concepts.

The embodiment of FIG. 8 is characterized by the functional blocks 610a, 610b, 610c of respective SMU channels being configured on a same FPGA or ASIC platform 604. In this manner, for example, two SMU channels may be provided per device plugged into slots of the TDM digital bus 102. As shown, the functional block of each SMU channel is connected via the TDM digital bus 102 as in the example of FIG. 6, and is further connected to a multiplexer (Multiplexer (MUX)) 606 in the FPGA/ASIC. When connected via a MUX 606, an SMU channel can communicate directly with any of the other SMU channels without going through a data receiver (420a, and the like) and a data transmitter (422a, and the like) on each digital block (610a, and the like). For this reason, a MUX/bus selection switch 624a of data for the DAC data source switch (436a, and the like) and a MUX/bus selection switch 626a of for the IREF switch (424a, and the like) are provided as shown in FIG. 8.

As a result, by using a selector (608a, 608b, 608c) in the MUX 606 when inputting a feedback control value of a desired SMU channel to a predetermined SMU channel, a control value can be passed at a higher speed without time division multiplexing communication data for each SMU channel and without concern of a bus transmission delays. Accordingly, the feedback band of a V feedback controller (426a, and the like) and an I feedback controller (428a, and the like) of each SMU channel may be increased, and higher operational speeds may be realized.

Note that, as can be understood from the configuration of device 600, control between SMU channels by data communication through time-division multiplexing using the TDM digital bus 102 and communication with other devices connected to the TDM digital bus 102 are also possible.

Furthermore, operations in the FVFV mode and the FVFI mode of the previously described FIGS. 6 and 7 may similarly be realized in the embodiment of FIG. 8.

Note that blocks 612a, 612b, and 612c represent analog blocks of each SMU channel and are connected from each digital block on the FPGA/ASIC block 604.

Note that the previous embodiments can be realized by replacing the master SMU/slave SMU(s) with a master power source/slave power source(s).

Figure 9:
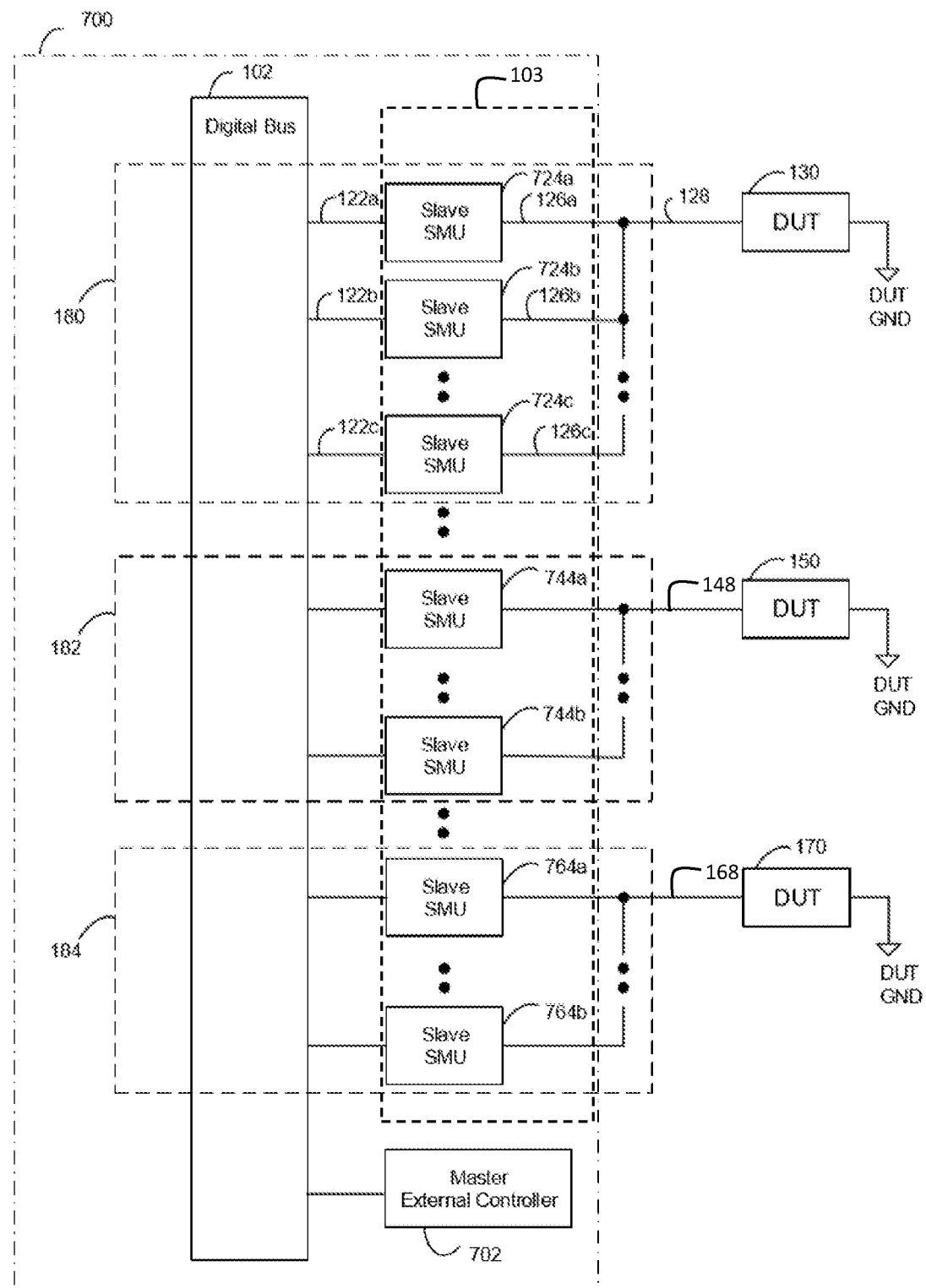
FIG. 9 is a block diagram illustrating a current supply device according to another embodiment of the inventive concepts.

FIG. 9 is a schematic diagram of a current supply device 700 according to another embodiment of the inventive concepts.

The embodiment of FIG. 9 is characterized by all the SMUs of the supply groups connected to the TDM digital bus 102 being operated as slave SMUs. That is, the supply group 180 is configured of slave SMU 724a, slave SMU 724b and slave SMU 724c. The supply group 182 is configured of slave SMU 744a and 744b, and the supply group 184 is configured of slave SMU 764a and slave SMU 764b.

In addition, the embodiment of FIG. 8 is further characterized by the provision of a master external controller connected to the TDM digital bus 102.

When a supply group 180, 182 or 184 is operated in the FV mode, the measured value of the output voltage of a predetermined slave SMU in the supply group is transmitted to the master external controller 702 via the TDM digital bus 102. The master external controller determines a corresponding voltage measurement value thereof as described above in connection with the master SMUs of the previous embodiments. This measurement voltage is transmitted via the TDM digital bus 102 as a feedback voltage value to all the slave SMUs in the supply group, and each slave SMU is operated accordingly in the FV mode.

When a supply group 180, 182 or 184 is operated in the FI mode, a measurement value of the output current of all the slave SMUs in the supply group is transmitted via the TDM digital bus 102 to the master external controller 702. A corresponding feedback current is determined as described above in connection with the master SMUs. This feedback current is transmitted from the master external controller 702 via the TDM digital bus 102 so that the output current of each slave SMU is equalized. In this manner, the supply group of slave SMUs is operated in the FI mode.

It is noted that the master external controller 702 can be realized by an external computer such as a PC (Personal Computer).

Note that this embodiment can also be realized by replacing the slave SMUs with power supplies such as those discussed in connection with FIG. 1.

Figure 10:
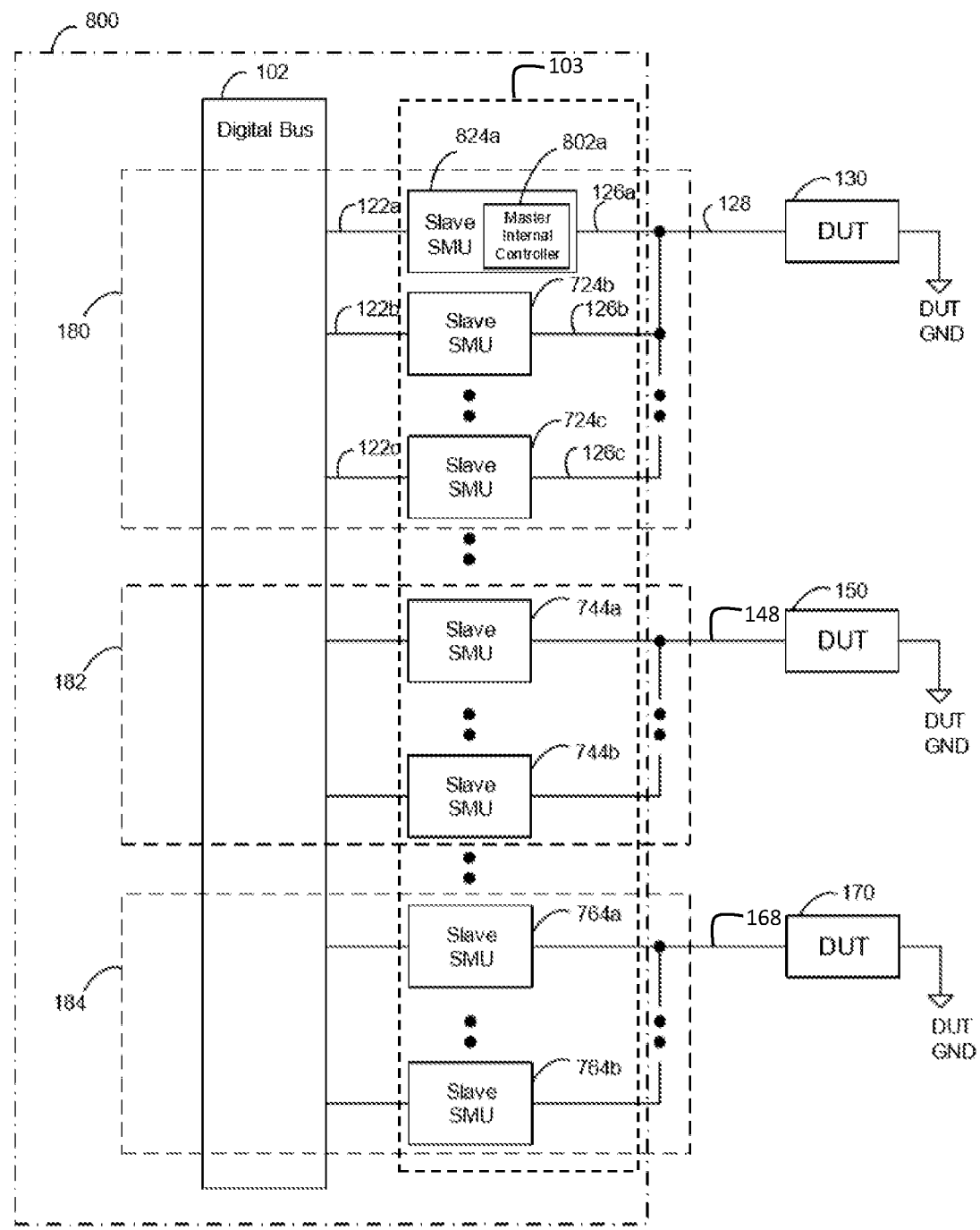
FIG. 10 is a block diagram illustrating a current supply device according to another embodiment of the inventive concepts.

FIG. 10 is a schematic diagram of a current supply device 800 according to another embodiment of the inventive concepts.

The current supply device 800 is essentially the same as the device 700 of FIG. 8, with the exception being the master external controller (Master External Controller) 702 of the device 700 is omitted in the device 800, and the functionality of the master external controller is instead assigned to an internal controller in one of the SMUs from among the plurality of slave SMUs. This internal controller is referred to in FIG. 10 as a master internal controller (Master Internal Controller) 802a. The operations of the master internal controller 802a for controlling the slave SMUs of each supply group in the FV and FI modes are the same as that described above in connection with the master external controller 702 of FIG. 9.

Note again that this embodiment can also be realized by replacing the slave SMUs with power supplies such as those discussed in connection with FIG. 1.

While the disclosure references exemplary embodiments, it will be apparent to those skilled in the art that various changes and modifications may be made without departing from the spirit and scope of the present teachings. Therefore, it should be understood that the above embodiments are not limiting, but illustrative.

What is claimed is:

1. A current supply device, comprising:
a multiplexed digital bus;
an output terminal; and
a group of power supplies and included in a set of available power supplies connected to the multiplexed digital bus, the group of power supplies comprising a master power supply and at least one slave power supply, the at least one slave power supply being controlled based on feedback information connected in parallel between the multiplexed digital bus and the output terminal, and included in a set of available power supplies connected to the multiplexed digital bus, wherein: the group of power supplies is controlled via the multiplexed digital bus such that a combined output current of the group of power supplies is applied to the output terminal, and the at least one slave power supply is controlled based on feedback information; the master power supply is responsive to commands received on the multiplexed bus to operate in a voltage source mode, and the at least one slave power supply is responsive to commands received on the multiplexed bus to operate in a current source mode; and the feedback information is indicative of a feedback current of the master power supply.

2. The current supply device according to claim 1, wherein designation of a first group of power supplies among the set of available power supplies is controlled via the multiplexed digital bus.

3. The current supply device according to claim 1, wherein the master power supply is responsive to commands received on the multiplexed digital bus to operate in a voltage source mode, and the at least one slave power supply is responsive to commands received on the multiplexed digital bus to operate in the voltage source mode, and
where the feedback information is indicative of a feedback voltage of the master power supply.

4. The current supply device according to claim 1, wherein designation of the master power supply and the at least one slave power supply among the available set of power supplies is controlled via the multiplexed digital bus.

5. The current supply device according to claim 1, wherein the output terminal is a first output terminal and the group of power supplies is a first group of power supplies, and the current supply device further comprises:
a second output terminal; and
a second group of power supplies connected in parallel between the multiplexed digital bus and the second output terminal,
wherein each of the second group of power supplies is controllable via the multiplexed digital bus such that a combined output current is applied to the second output terminal.

6. The current supply device according to claim 5, wherein the first and second groups of power supplies are included in a set of available power supplies connected to the multiplexed digital bus, and wherein designation of the first group of power supplies among the set of available power supplies is controlled via the multiplexed digital bus, and designation of the first group of power supplies among the set of available power supplies is controlled via the multiplexed digital bus.

7. The current supply device according to claim 6, wherein adding and removing power supplies from among the available set of power supplies to the first and second groups is controlled via the multiplexed digital bus.

8. The current supply device according to claim 1, wherein the multiplexed digital bus is a time-division multiplexed (TDM) digital bus.

9. The current supply device according to claim 1, wherein the output terminal is an output of a programmable switching array.

10. The current supply device according to claim 1, wherein a functional block of at least two power supplies of the group of power supplies are located on a same FPGA (Field Programmable Gate Array) platform or ASIC (Application Specific Integrated Circuits) platform.

11. The current supply device according to claim 1, wherein the set of available power supplies are operationally interchangeable.

* * * * *